(12) United States Patent
Götz et al.

(10) Patent No.: US 10,416,197 B2
(45) Date of Patent: Sep. 17, 2019

(54) APPARATUS AND METHOD FOR MEASURING AN ELECTRIC CURRENT IN AN ELECTRICAL CONDUCTOR

(71) Applicant: Dr. Ing. h.c. F. Porsche Aktiengesellschaft, Stuttgart (DE)

(72) Inventors: Stefan Götz, Forstern (DE); Hermann Dibos, Remchingen (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 51 days.

(21) Appl. No.: 15/838,540

(22) Filed: Dec. 12, 2017

(65) Prior Publication Data

US 2018/0164347 A1 Jun. 14, 2018

(30) Foreign Application Priority Data

Dec. 13, 2016 (DE) ........................ 10 2016 124 164

(51) Int. Cl.
| | | |
|---|---|---|
| *G01R 15/18* | (2006.01) | |
| *G01R 19/00* | (2006.01) | |
| *G01R 19/25* | (2006.01) | |
| *G01R 21/133* | (2006.01) | |
| *G01R 29/18* | (2006.01) | |
| *G01R 1/18* | (2006.01) | |
| *G01R 21/06* | (2006.01) | |

(52) U.S. Cl.
CPC ............ *G01R 15/181* (2013.01); *G01R 1/18* (2013.01); *G01R 19/0092* (2013.01); *G01R 19/2513* (2013.01); *G01R 21/133* (2013.01); *G01R 29/18* (2013.01); *G01R 21/06* (2013.01)

(58) Field of Classification Search
CPC ........ G01R 15/181; G01R 1/18; G01R 29/18; G01R 19/0092; G01R 19/2513; G01R 21/133; G01R 21/06
See application file for complete search history.

(56) References Cited

U.S. PATENT DOCUMENTS

| 6,198,123 | B1 * | 3/2001 | Linder | ................... | H01L 28/40 257/298 |
| 2006/0232265 | A1 * | 10/2006 | Fritsch | ................. | G01R 15/181 324/142 |
| 2008/0048646 | A1 * | 2/2008 | Wilkerson | ........... | G01R 15/181 324/127 |

(Continued)

FOREIGN PATENT DOCUMENTS

| WO | WO 2015083618 | * | 6/2015 |
| WO | 2015104189 A1 | | 7/2015 |

OTHER PUBLICATIONS

Search Report, DE 102016124164.4, dated Sep. 4, 2017 (Year: 2017).*

(Continued)

*Primary Examiner* — Daniel R Miller
(74) *Attorney, Agent, or Firm* — RatnerPrestia

(57) ABSTRACT

An apparatus for measuring an electric current in an electrical conductor, wherein the apparatus comprises a detection apparatus for detecting the electric current, wherein the apparatus comprises a shielding apparatus for shielding a coupling between the electrical conductor and the detection apparatus, wherein the shielding apparatus is designed in such a way that the shielding of the coupling can be controlled.

9 Claims, 7 Drawing Sheets

(56) References Cited

U.S. PATENT DOCUMENTS

2012/0243140 A1 9/2012 Gan
2014/0340072 A1* 11/2014 Chamarti ............. G01R 15/181
　　　　　　　　　　　　　　　　　　　　　324/76.11
2015/0293150 A1 10/2015 Wand

OTHER PUBLICATIONS

Hewson et al., The effect of electrostatic screening of Rogowski coils designed for wide-bandwidth current measurement in power electronic applications, 2004 35th Annual IEEE Power Electronics Specialists Conference, 2004 (Year: 2004).*
Chattock, "On a Magnetic Potentiometer", Proceedings of the Physical Society of London, 1887, pp. 23-26.
Rogowski et al., "The Measurement of Magnetic Voltage (Measurement of the Line (Integral of Magnetic Field Strength)", Electrotechnology Archive, vol. 1, Edition 4, 1912 with translation, 17 pages.
Hain et al., "Highly Dynamic Current Measurements with Inductive Current Sensors—a Numerical Recipe", PCIM Europe, 2014, pp. 1617-1624.

* cited by examiner

APPARATUS AND METHOD FOR MEASURING AN ELECTRIC CURRENT IN AN ELECTRICAL CONDUCTOR

CROSS-REFERENCE TO RELATED APPLICATIONS

This application claims priority to German Patent Application No. DE 10 2016 124 164.4, filed Dec. 13, 2016, which is incorporated by reference herein in its entirety.

FIELD OF THE INVENTION

The present invention is based on an apparatus for measuring an electric current in an electrical conductor, wherein the apparatus comprises a detection apparatus for detecting the electric current, wherein the apparatus comprises a shielding apparatus for shielding a coupling between the electrical conductor and the detection apparatus.

BACKGROUND OF THE INVENTION

Document US 2006/0232265 A1, which is incorporated by reference herein, discloses an apparatus for measuring an electric current, wherein the apparatus comprises a Rogowski-Chattock coil and a circuit which is connected to the Rogowski-Chattock coil. In this case, the Rogowski-Chattock coil and the circuit each have a shield, wherein the two shields have a connection to ground. In this case, the shield of the Rogowski-Chattock coil prevents or reduces a capacitance acting between the Rogowski-Chattock coil and an electrical conductor to be measured.

Document US 2014/0340072 A1, which is incorporated by reference herein, discloses a Rogowski-Chattock coil which comprises a shield between itself and an electrical conductor to be measured by the Rogowski-Chattock coil. In this case, the shield prevents or reduces a capacitance acting between the Rogowski-Chattock coil and the electrical conductor.

Document 2012/0243140 A1, which is incorporated by reference herein, discloses a current measuring arrangement, wherein a conductor to be measured is surrounded by a coil, and a dielectric material is provided between the coil and the conductor.

In addition, document WO 2015/104189 A1, which is incorporated by reference herein, discloses a Rogowski-Chattock coil comprising two shields, wherein a dielectric material is provided between an electrical conductor to be measured and the Rogowski-Chattock coil, and an insulation is provided between the shields.

Furthermore, document US 2015/0293150 A1, which is incorporated by reference herein, discloses an electronic vehicle component comprising a current sensor, wherein the current sensor is protected against a magnetic field of a switch by a shield.

In the case of the apparatuses known from the prior art for measuring an electric current in an electrical conductor, a Rogowski-Chattock coil is often used, wherein the Rogowski-Chattock coil surrounds an electrical conductor to be measured in order to measure an electric current in the electrical conductor by way of a voltage which is induced in the Rogowski-Chattock coil. In electric vehicles and in the power electronics system of motor vehicles, there is an increasing incidence of very high voltages which can couple to the Rogowski-Chattock coil by way of their electric field and can thereby corrupt the measurement result of the Rogowski-Chattock coil. In order to prevent corruption of this kind, a shield at a fixed potential is often positioned between the Rogowski-Chattock coil and the electrical conductor to be measured, said shield preventing or reducing the electrical coupling. However, the use of a shield of this kind reduces the measurement bandwidth of the Rogowski-Chattock coil since the shield constitutes a capacitance and, respectively, acts like a capacitance on the Rogowski-Chattock coil.

SUMMARY OF THE INVENTION

An object of the present invention is to provide an alternative apparatus to the prior art for measuring an electric current in an electrical conductor. In this case, the apparatus should preferably allow particularly accurate and simple measurement of the electric current.

The object is achieved by an apparatus for measuring an electric current in an electrical conductor, wherein the apparatus comprises a detection apparatus for detecting the electric current, wherein the apparatus comprises a shielding apparatus for shielding a coupling between the electrical conductor and the detection apparatus, wherein the shielding apparatus is designed in such a way that the shielding of the coupling can be controlled.

The apparatus according to aspects of the invention has the advantage over the prior art that the controllable shielding of the coupling allows particularly accurate and simple measurement of the electric current.

The coupling preferably comprises a capacitive coupling.

Advantageous refinements and developments of the invention can be gathered from the dependent claims and from the description with reference to the drawings.

According to a preferred embodiment of the present invention, it is provided that the shielding apparatus is arranged at least partially between the electrical conductor and the detection apparatus. This allows particularly simple control of the shielding of the coupling and also effective shielding.

According to a further preferred embodiment, it is provided that the detection apparatus comprises a Rogowski-Chattock coil. This allows a particularly practicable detection apparatus which has been tested in a variety of fields of application. This therefore allows particularly accurate and simple measurement of the electric current.

According to a preferred embodiment, it is provided that the shielding apparatus comprises a potential-controlled shield. The potential-controlled shield can be used to particularly advantageously match the potential of the shield to the potential of the detection apparatus, preferably of the Rogowski-Chattock coil, and therefore avoid or minimize a potential difference between the potential-controlled shield and the detection apparatus, preferably the Rogowski-Chattock coil.

According to a preferred embodiment of the present invention, it is provided that the shielding apparatus comprises a control unit for controlling the potential-controlled shield. According to aspects of the invention, the control unit preferably comprises or is a feedback loop, which is preferably coupled to the detection apparatus. This advantageously allows the potential-controlled shield to be controlled particularly in a manner matched to a voltage which is applied to the detection apparatus, preferably to the Rogowski-Chattock coil.

According to a preferred embodiment of the present invention, it is provided that the control unit is configured in such a way that an electrical potential of the detection apparatus is applied to the potential-controlled shield. This has the particularly advantageous effect that a capacitive effect between the potential-controlled shield and the detection apparatus, preferably the Rogowski-Chattock coil, is reduced or avoided in comparison to the prior art.

A further subject matter of the present invention is a method for measuring an electric current in an electrical conductor, in particular using an apparatus according to aspects of the invention, wherein the electric current is detected using a detection apparatus of the apparatus, wherein a coupling between the electrical conductor and the detection apparatus is shielded using a shielding apparatus of the apparatus, wherein the shielding of the coupling is controlled using the shielding apparatus. The advantages of the apparatus according to aspects of the invention correspondingly apply to the method according to aspects of the invention too.

According to a further preferred embodiment of the present invention, it is provided that a potential-controlled shield of the shielding apparatus is controlled by a control unit of the shielding apparatus.

Aspects of the invention also preferably provide that the potential-controlled shield is controlled by the control unit in such a way that an electrical potential of the detection apparatus is applied to the potential-controlled shield.

BRIEF DESCRIPTION OF THE DRAWINGS

Further details, features and advantages of the invention can be gathered from the drawings, and also from the following description of preferred embodiments with reference to the drawings. Here, the drawings illustrate merely exemplary embodiments of the invention which do not limit the essential concept of the invention.

DETAILED DESCRIPTION OF THE INVENTION

Figure 1:
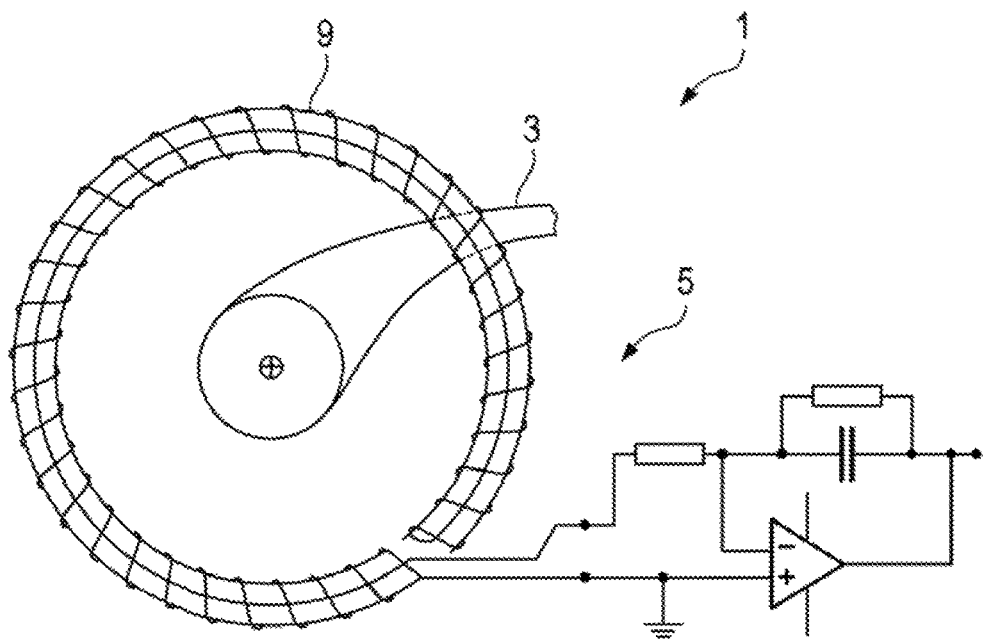
FIGS. 1, 2, 3, and 6 show apparatuses known from the prior art for measuring an electric current in an electrical conductor.
Figure 2:
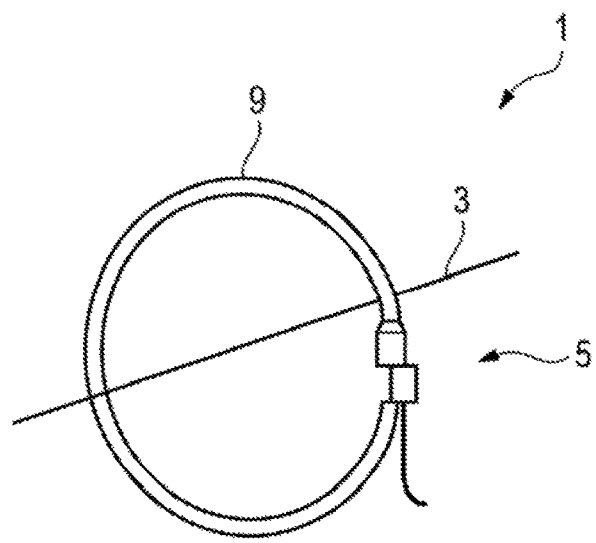
Figure 3:
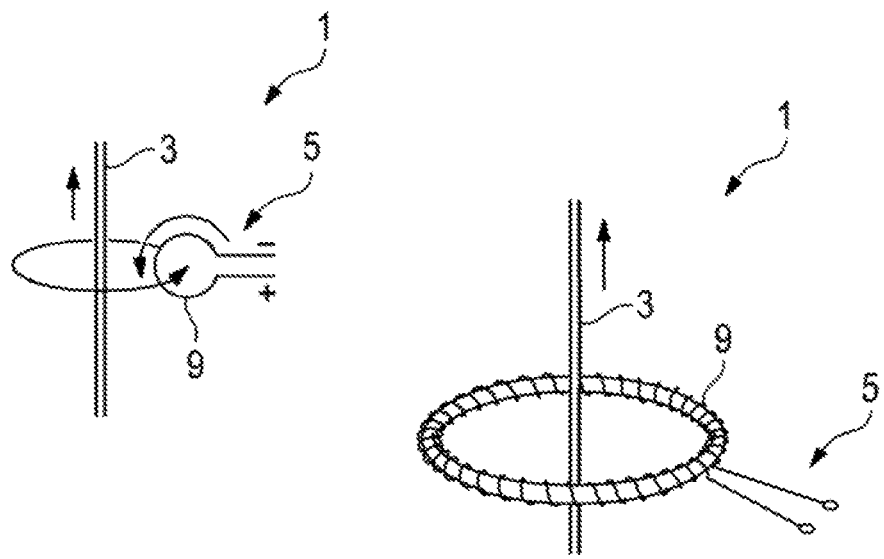

Exact current measurements are a central element of power electronics and EMC technology. On account of control loops, current measurements generally directly determine the quality of the overall system.

Central quality properties of current measurements comprise the following:
high spectral bandwidth (both at low and high frequencies)
small measurement offset (constant error)
low drift (fluctuating error)
controllable error
high dynamic range (measurement range in respect of the amplitude)
exact-phase measurement (for example for exact-time detection of current zero crossings)

The detection of alternating currents with a very high dynamic range (from µA (microamperes) to kA (kiloamperes)) and high level of accuracy is generally performed by means of their magnetic field. In the process, in addition to Hall sensors which are usually subject to high measurement offsets, the Rogowski-Chattock coil, which is generally used without a magnetic core and therefore without magnetic inertia which makes high-frequency measurement difficult, stands out.

Rogowski-Chattock coils, which use a toroidal coil to be placed around the measurement current, are known, for example, from "A. P. Chattock (1887). On a magnetic potentiometer. Proceedings of the Physical Society of London 23-26." and "W. Rogowski and W. Stelnhaus (1912). Die Messung der magnetischen Spannung: Messung des Unlenintegrals der magnetischen Feldstarke [The measurement of the magnetic voltage: measurement of the linear integral of the magnetic field strength]. Archiv für Elektrotechnik, 1(4):141-150.". In contrast, apparatuses are also known for example from "S. Hain, M. Bakran (2014). Highly dynamic current measurements with inductive current sensors—a numerical recipe. PCIM Europe, 1617-1624.)" in which the coil does not necessarily surround the electrical conductor.

The Rogowski-Chattock coil allows very high bandwidths from the millihertz range to the megahertz range, but generates a measurement signal which is produced by magnetic induction and is therefore proportional to the derivative of the measurement current. No DC currents can be measured for this reason.

FIG. 1 to FIG. 3 and FIG. 6 show apparatuses 1 known from the prior art for measuring an electric current in an electrical conductor 3, wherein each apparatus 1 comprises a Rogowski-Chattock coil 9 in each case.

The measurement principle of the Rogowski-Chattock coil is based on magnetic induction. Here, for example, electrical coupling to the object to be measured or electromagnetic interference (EMI) by other devices distorts the measurement result, as a result of which measurement errors are produced. However, particularly in the case of high voltages as are used in power electronics and in electric vehicles, the electrical or capacitive coupling, or coupling generated by electric fields, to the measurement current can no longer be ignored.

The prior art therefore discusses shielding of the coil, but this has the technical disadvantage that the shielding considerably reduces the bandwidth, specifically at high frequencies.

A further disadvantage of the apparatuses 1 known from the prior art is that, on account of the high impedance of the measurement signal or on account of only low currents which flow from the coil into the measurement amplifier and are not sufficient to be able to stabilize the signal against interference, weak voltage signals, for example, of the electrical conductor 3 can also be coupled into the measurement signal.

Figure 4:
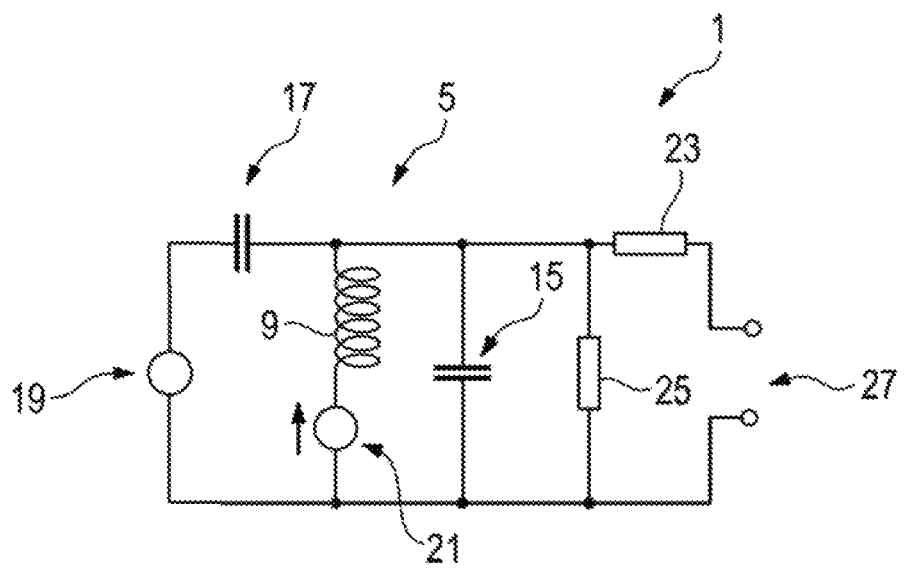
FIG. 4 and FIG. 5 show equivalent circuit diagrams of apparatuses known from the prior art for measuring an electric current in an electrical conductor.
Figure 5:
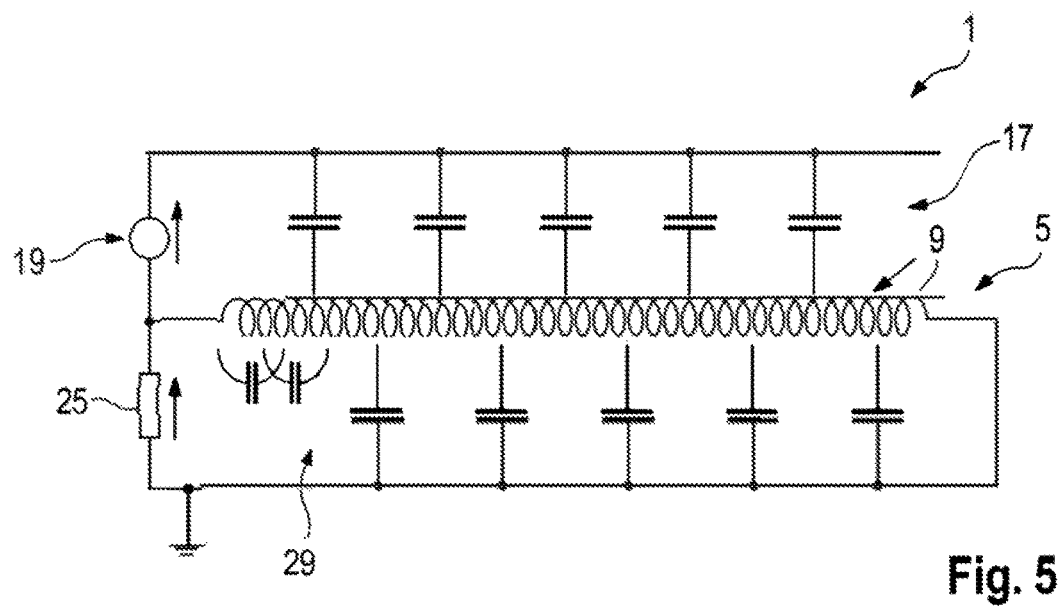

FIG. 4 and FIG. 5 show equivalent circuit diagrams of apparatuses known from the prior art for measuring an electric current in an electrical conductor.

Here, FIG. 4 describes a reduction in the bandwidth, which can be measured by a Rogowski-Chattock coil 9, by a shield as is known from the prior art in a simplified equivalent circuit diagram by way of an additional capacitance 15. As shown by way of example in FIG. 4, the shield forms a capacitor 15 between the ground connection of the shield and the measurement coil 9. FIG. 4 also shows the undesired interference or the electrical coupling to the measurement current using a further capacitor 17 and a voltage source 19. Furthermore, FIG. 4 shows the induced measurement signal using a current source 21. A first resistor 23, a second resistor 25 and two connections 27 for an evaluation unit complete the simplified equivalent circuit diagram in FIG. 4. All of the capacitances form, together with the inductance, filters or resonances which can reduce the measurement bandwidth by orders of magnitude.

FIG. 5 shows a further simplified equivalent circuit diagram, in particular a pi equivalent circuit diagram, which shows that, in addition to the capacitance 15 between the coil conductor 9 and the shield, further capacitances 29 can also occur between the conductors and create Interference, particularly at high frequencies, as soon as phase differences between successive turns of the Rogowski-Chattock coil 9 are formed on account of the short wavelengths.

Figure 6:
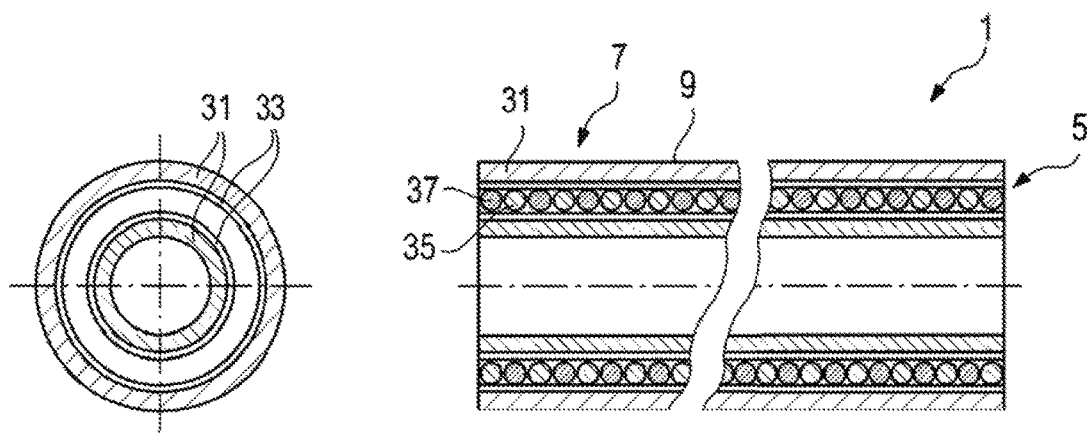
Figure 6:
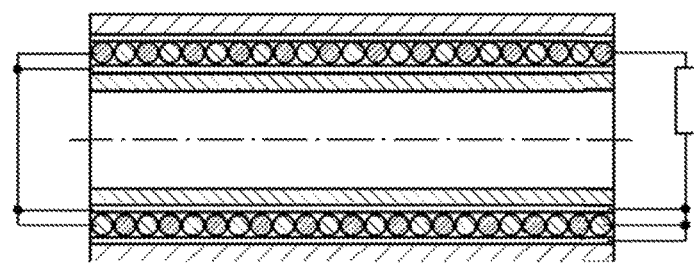

FIG. 6 shows that, for the best possible shielding result, the shield surrounds all of the conductors of the Rogowski-Chattock coil and also fills the intermediate spaces between the conductors. To this end, the shield comprises a shielding 31 and also an isolator 33 or spacer for increasing the distance and therefore for reducing the capacitance. The shield also comprises an additional shielding 35 for the capacitance between the turns 37 of the Rogowski-Chattock coil 9. Therefore, an insulated coil conductor 37 is produced. However, one disadvantage of the embodiment shown in FIG. 6 is that the capacitance between the shield and the coil conductor 37 increases, rising at least approximately with the surface and inversely with the distance.

FIG. 7 to FIG. 13 show exemplary embodiments of the present invention. Here, the apparatus 1 for measuring an electric current in an electrical conductor 3 comprises a detection apparatus 5 and a shielding apparatus 7. Here, the detection apparatus 5 is provided for detecting the electric current and the shielding apparatus 7 is provided for shielding a coupling between the electrical conductor 3 and the detection apparatus 5. The shielding apparatus 7 is also designed in such a way that the shielding of the coupling can be controlled. By way of example, the detection apparatus 5 comprises a Rogowski-Chattock coil 9, and the shielding apparatus 7 comprises a potential-controlled shield 11. The shielding apparatus 7 further comprises a control unit 13 for controlling the potential-controlled shield 11, and the control unit 13 is preferably configured in such a way that an electrical potential of the detection apparatus 5 is applied to the potential-controlled shield 11.

Figure 7:
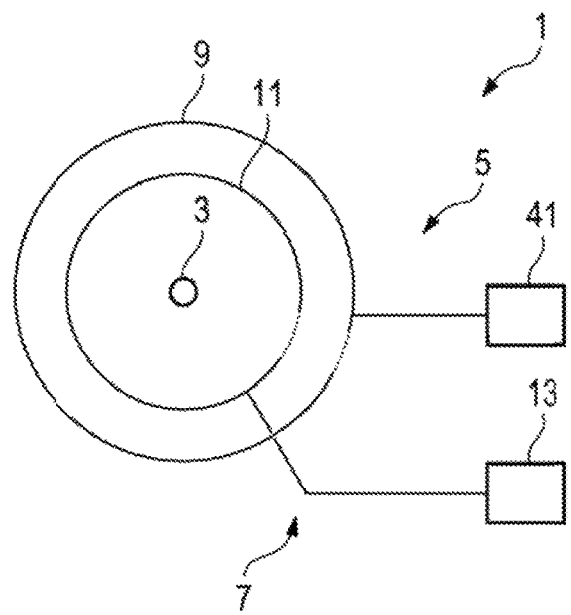
FIGS. 7, 8, 9, 10, 11, 12, and 13 show exemplary embodiments of the present invention.
Figure 8:
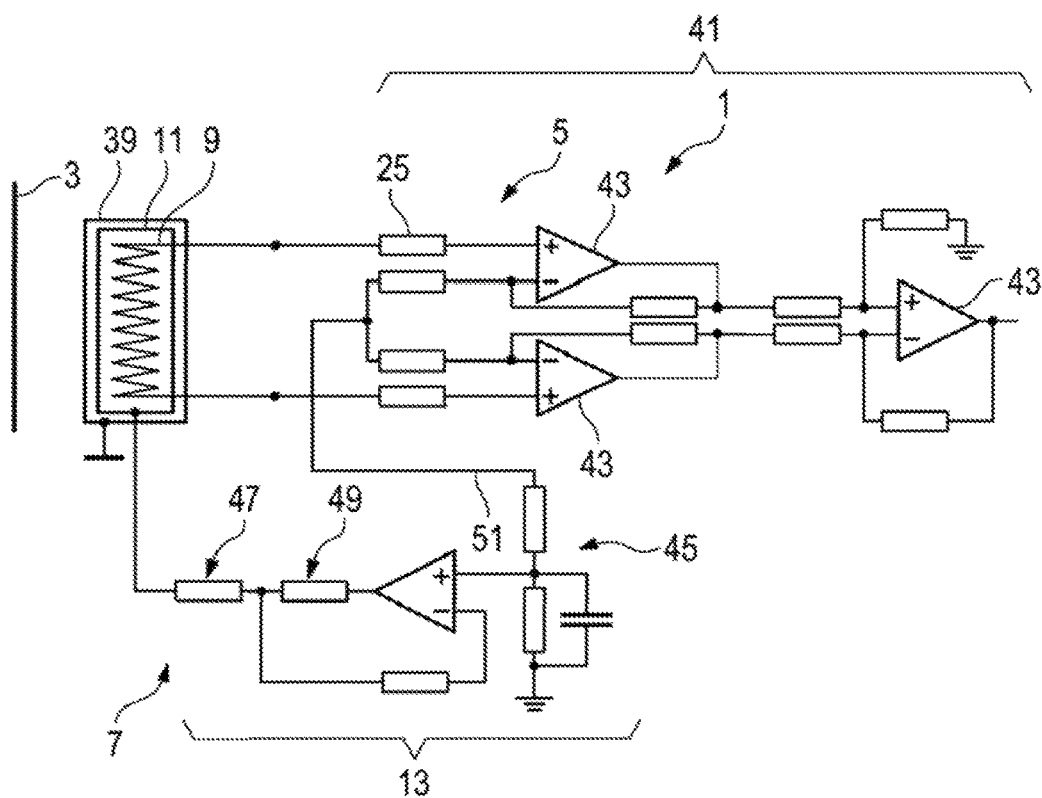
Figure 9:
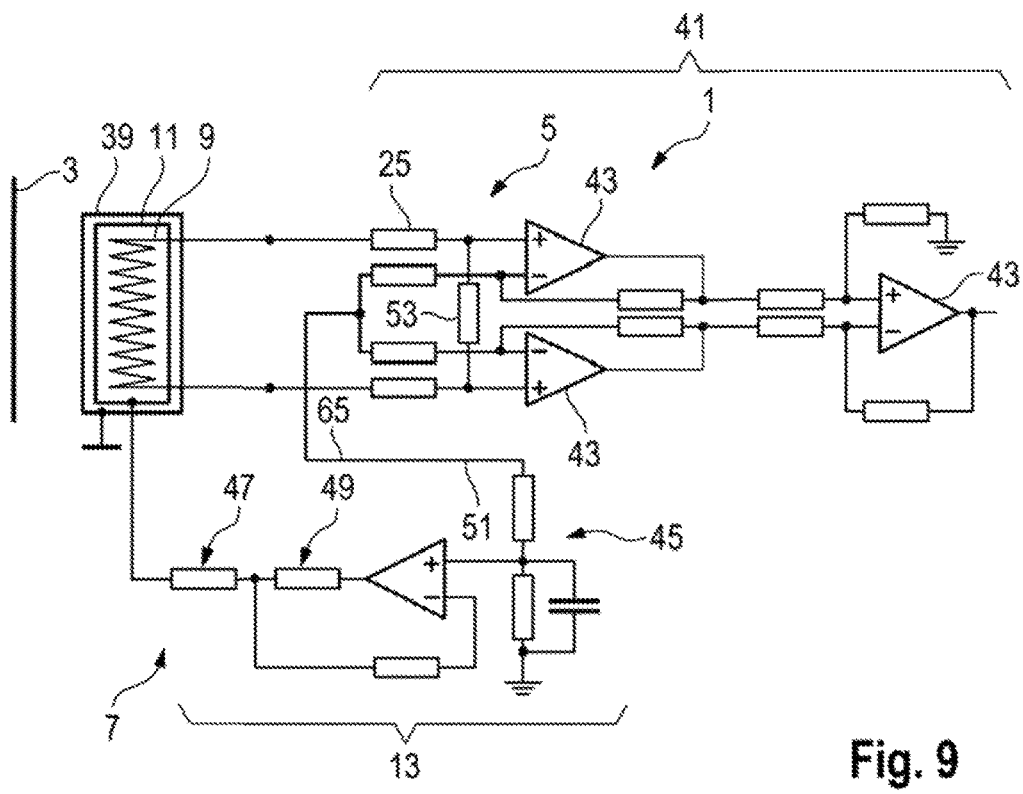

As shown in FIG. 7 to FIG. 9, the shielding apparatus 7, preferably the potential-controlled shield 11, is at least partially arranged between the electrical conductor 3 and the detection apparatus 5.

The exemplary embodiments can advantageously be used to reduce the capacitive influences of a shield, which is substantially known from the prior art, on the detection apparatus 5 and therefore on a measurement signal for measuring the electric current in the electrical conductor 3. By way of example, the influence of the capacitance for shielding can be further reduced, in addition to an increase in the distance as is known from the prior art. Owing to the shielding apparatus 7 being designed in such a way that the shielding of the coupling can be controlled, the effect of the capacitance can be reduced or completely removed by the voltage difference across the capacitance being minimized. One idea of the invention is that a passive shield known from the prior art which is connected, for example, to ground or another fixed potential, is not used. Instead, a shield 11 which is subject to open- or closed-loop control is used. It is preferably provided here that the potential of the potential-controlled shield 11 is controlled substantially to the potential of the lines of the measurement coil or of the Rogowski-Chattock coil 9. It is particularly preferably provided that the potential of the potential-controlled shield 11 is controlled substantially to the potential of the lines of the Rogowski-Chattock coil 9 in such a way that the potential of the potential-controlled shield 11 follows the time profile of the potential of the lines of the Rogowski-Chattock coil 9. As a result, it is advantageously possible to minimize the voltage difference across the capacitance between the potential-controlled shield 11 and the Rogowski-Chattock coil. As a result, the filtering effect of the additional capacitance and also resonances occurring on account of the additional capacitance can advantageously be minimized or avoided.

Furthermore, it is also advantageous that the driven or potential-controlled shield 11 itself is stable on account of the active control.

According to aspects of the invention, it is further provided that the apparatus 1 comprises a further shield 39, preferably a conventional ground shield, wherein the further shield 39 is designed in such a way that the further shield 39 at least partially surrounds the potential-controlled shield 11. This allows a particularly stable potential-controlled shield 11. This is shown, by way of example, in FIG. 8 to FIG. 13.

FIG. 8 shows an exemplary embodiment of the present invention using an equivalent circuit diagram. Here, the detection apparatus 5 comprises an evaluation unit 41, also shown in FIG. 7, wherein the evaluation unit 41 comprises an instrument amplifier. Here, it is provided, for example, that the instrument amplifier comprises three operational amplifiers 43 and resistors 25. Furthermore, FIG. 8 shows, by way of example, that the control unit 13 comprises a low-pass filter 45, preferably a resistor/capacitor combination or an RC element. Furthermore, the control unit 13 comprises a coupling 47 of the potential-controlled shield 11 and an optional current limiting device 49. As shown by way of example in FIG. 8, the evaluation unit 41 is coupled to the control unit 13 via a mean potential 51 of the Rogowski-Chattock coil 9.

Therefore, amplification of the feedback path of <1 is advantageously made possible and therefore an apparatus 1 is provided, which apparatus ensures a particularly high stability of the overall system and avoids oscillations or considerably reduces oscillations in comparison to the prior art. Suppression or a significant reduction in high-frequency effects is possible particularly with the aid of the low-pass filter 45 in the feedback arrangement or in the control unit 13 or in the shielding apparatus 7.

According to aspects of the invention, it is preferably provided that the low-pass filter 45 is configured in such a way that half the wavelength of the limit frequency of the low-pass filter 45 in the feedback arrangement is greater than or equal to the extent of the circuit of the feedback unit or the shielding apparatus 7, preferably of the control unit 13 or, at the minimum, of the length of the longest current path, preferably of the longest current path in the apparatus 1, particularly preferably of the longest current path in the shielding apparatus 7, very particularly preferably of the longest current path in the control unit 13 or feedback unit. As an alternative or in addition, it is particularly preferably provided that the low-pass filter 45 is configured in such a way that half the wavelength of the limit frequency of the low-pass filter 45 is greater than or equal to the length of a coil conductor length of the Rogowski-Chattock coil 9.

Furthermore, it is also provided, for example, that the apparatus 1 is designed to be particularly small in comparison to apparatuses known from the prior art. This advantageously allows phase differences at high voltages to be minimized.

The exemplary embodiment shown in FIG. 9 corresponds substantially to the exemplary embodiment shown in FIG. 8. However, the evaluation unit 41 shown in FIG. 9 comprises an impedance matching arrangement 53.

Figure 10:
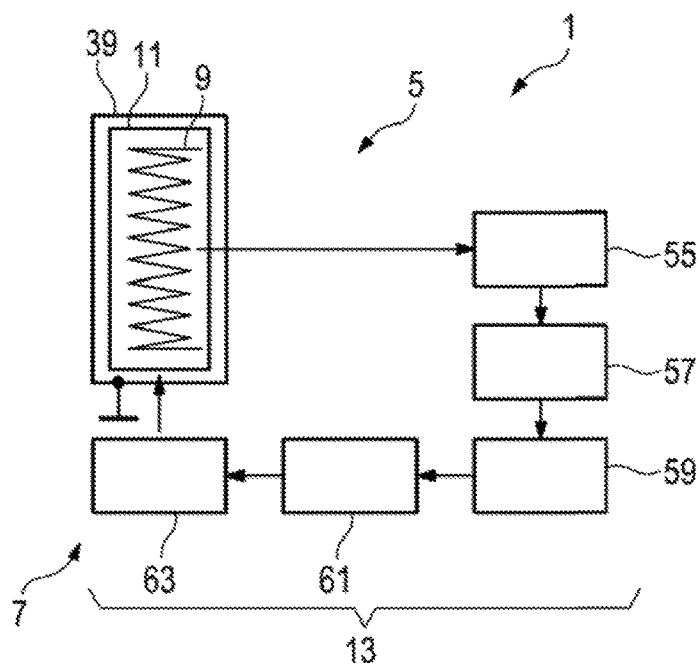

FIG. 10 shows a further exemplary embodiment of the present invention, wherein the apparatus 1 comprises a measurement amplifier 55, preferably the instrument amplifier, a mean potential-forming arrangement 57, preferably for forming the mean potential 51 of the Rogowski-Chattock coil 9, an amplifying and/or damping arrangement 59 which preferably comprises an operational amplifier 43 and a resistor 25, a filter 61, preferably the low-pass filter 45, and a shield driver 63 for driving the potential-controlled shield 11.

Figure 11:
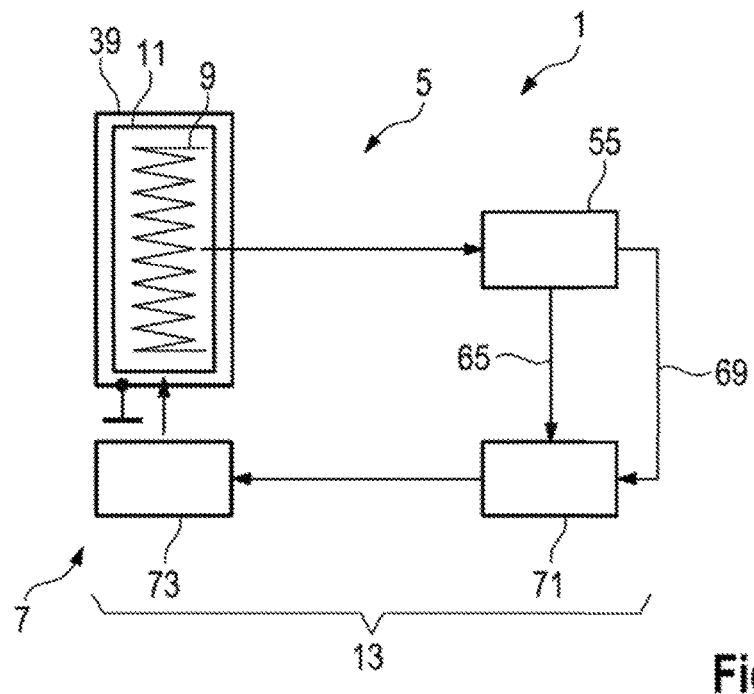
Figure 12:
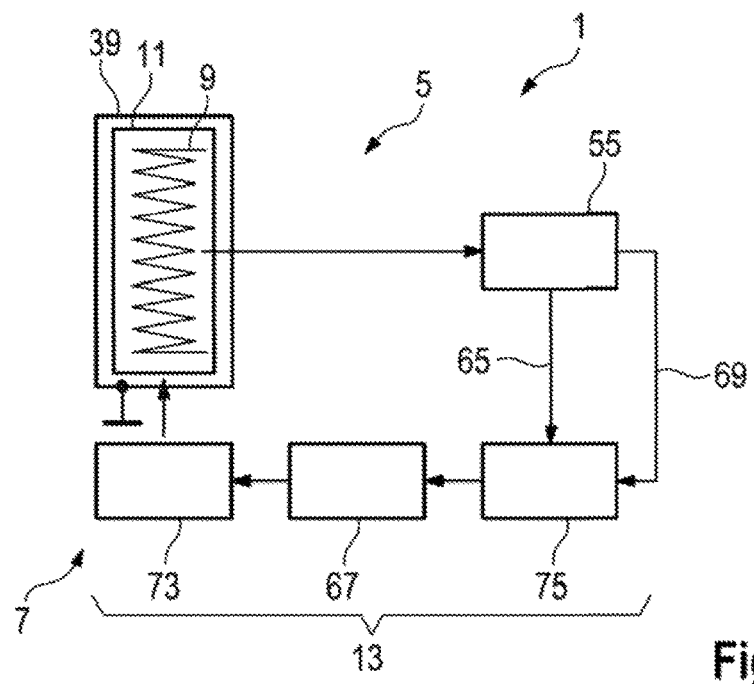
Figure 13:
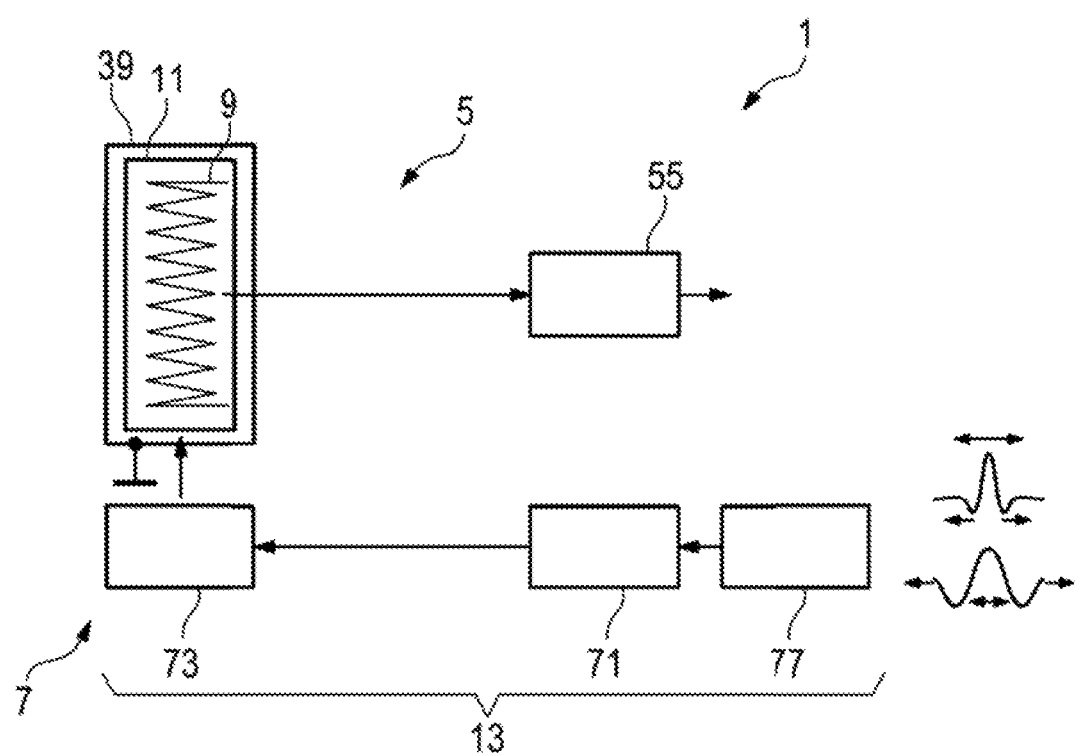

According to aspects of the invention, further exemplary embodiments, illustrated in FIG. 11 to FIG. 13, are provided, in particular by modifications to the control unit 13 or the feedback arrangement. This allows, in particular, compensation of phase offset and high-frequency effects of the feedback loop. Here, the effect of a possible limiting and a possible stabilization limit at high frequencies is particularly advantageously reduced. For example, delays in the feedback loop of a common-mode potential 65 of the measurement coil or of the Rogowski-Chattock coil 9 over the intermediate stages starting from a certain frequency can be reduced in this way. Therefore, a delay in transmission or an application of a common-mode signal, preferably a common-mode sinusoidal signal, particularly preferably of the mean value of the two coil connections, from the measurement coil or from the Rogowski-Chattock coil 9 onto the shield or onto the potential-controlled shield 11 is advantageously avoided. For example, a signal, preferably the common-mode signal, is therefore prevented from being fed back in antiphase starting from a certain frequency and therefore a first resonance is advantageously avoided. In addition, further resonances which are produced by the first resonance can therefore be advantageously avoided, in particular if a time delay of the feedback arrangement reaches uneven multiples of half the period duration.

It is preferably provided that the apparatus 1 comprises a compensation filter, preferably an optional conventional and preferably equalized filter 67. Therefore, it is advantageously possible to reduce the effect of a possible limiting and a possible stability limit at high frequencies taking into account the dead time of the feedback arrangement and further parameters of the measurement coil, such as the capacitances of the measurement coil for example, in particular in the case of periodic signals. This is achieved, for example, by compensation of the phase. Here, the phase is preferably increased by a further pi/2 for a specific frequency in order to again exhibit an approximate total phase of a multiple of pi.

It is furthermore particularly preferably provided that a suitable mode is switched on for the targeted measurement of transient signals, such as pulses for example, which mode dispenses with compensation of this kind and instead attenuates any feedback, preferably starting from this resonant frequency.

It is also preferred that the feedback arrangement or the control unit 13 comprises an active signal filter. This is achieved, for example, by the shielding of the coupling, preferably the coupling between the electrical conductor 3 and the detection apparatus 5, being controlled by the common-mode potential or common-mode signal 65 and a further signal, preferably by the output signal 69, particularly preferably by the difference between the two coil connections. The common-mode signal 65 and the output signal 69 or the conductors via which the two signals are transmitted are shown by way of example in FIG. 11 additionally shows a processing device 71 of the apparatus 1 for combination of the common-mode signal 65 and of the output signal 69 and/or for filtering and/or for amplitude matching and/or for further functions. Finally, FIG. 11 shows that the apparatus comprises a shield driver 73.

According to aspects of the invention, it is preferably provided that the apparatus 1 already comprises an active filter for suppressing a signal, preferably the common-mode signal 65 and/or the output signal, in the measurement coil. Therefore, an amplifier of the apparatus 1, preferably the instrument amplifier, is advantageously not overloaded. Overloading of the amplifier includes, for example, the amplifier being overdriven, dynamic limits of the amplifier being exceeded, an increased measurement error which results on account of the higher signal relating to the relative measurement error, common-mode crosstalk being increased or nonlinearities being induced.

It is also provided according to aspects of the invention that specific signals or modes are to be isolated and/or specific signal components are suppressed in a targeted manner. According to aspects of the invention, it is also provided, for example, that the apparatus comprises a tunable filter. It is particularly preferably provided that the tunable filter Is configured in such a way as to perform a Fourier analysis, a wavelet analysis, and/or related transforms, preferably in physical terms.

In contrast to the prior art, which avoids (primarily passive) filters upstream of the first amplifier stage because these generally mean, as additional damping, a level loss and increase the noise (both thermal Johnson-Nyquist noise and also a shot noise), this does not explicitly apply here. Active filters at this point increase the distortion in the case of non-ideal impedance conversion at the same time.

According to aspects of the invention, it is particularly provided, in the case of active signal filters, that a positive map of the equivalent direct filter is provided. This is particularly advantageous since the feedback has a dampening effect. Here, it is particularly preferably provided that a feedback filter for generating an active input filter maps the frequency profile which a direct passive input filter would have (non-inverted or the like).

According to aspects of the invention, it is also advantageously provided that the total amplification of the feedback path for higher stability for all frequencies is selected to be <1.

It is preferably provided that the apparatus 1 comprises an anti-alias filter. Here, the anti-alias filter is configured in such a way that AD conversion of the measurement signal can be carried out. Here, it is provided, for example, that the filter suppresses spectral components which lie close to and above the sampling rate (see Shannon's Theorem).

FIG. 12 shows an apparatus 1 comprising an active signal filter. Here, the apparatus 1 optionally comprises the conventional filter 67 and a tracker 75. The apparatus 1 shown in FIG. 12 is particularly advantageous for signal isolation. If a measurement signal contains, for example, a plurality of signal components or modes, the active filter of the apparatus 1 can be used for isolating one of these components. For example, it is provided that the active filter comprises the conventional or traditional filter 67. However, it is preferably provided that the active filter comprises an adaptive filter or the tracker 75. As a result, a higher signal-to-noise ratio and exact matching to the signal can advantageously be achieved. Here, the tracker 75 is also preferably configured in such a way that a mode can be detected by the tracker and can be amplified in relation to further signal components in the feedback path. The tracker 75 is particularly preferably configured in such a way that the feedback is performed in a positive manner. The tracker 75 is very particularly preferably configured in such a way that the amplification is <1. According to aspects of the invention, it is furthermore also provided, for example, that the tracker 75 is configured in such a way that adaptive signal changes, preferably phase shifts or frequency changes in the case of harmonic signals, can be detected by the tracker 75. According to aspects of the invention, the tracker 75 preferably comprises a resonant circuit, a PLL, a likelihood estimator and/or a Kalman filter. In a preferred development, the PLL is configured in such a way that the PLL generates a response on the basis of the input signal, for example an associated noise-free and phase-, amplitude- and frequency-correct sinusoidal signal from a noisy sinusoidal signal, and feeds it back. The tracker 75 illustrated by way of example in FIG. 12 is preferably provided for combination of the common-mode signal 65 and of the output signal 69 and/or for filtering and/or for amplitude matching and/or for further functions.

It is also preferably provided that the apparatus 1 is provided for signal suppression or an active filter of the apparatus 1 is provided for signal suppression. Here, the signal suppression corresponds substantially to the signal isolation, however the feedback is performed in a negative manner. For example, suppression of 50 Hz/60 Hz interference from the power supply system is provided.

FIG. 13 shows an apparatus comprising a tunable filter. Here, the apparatus 1 comprises a signal generator 77. The processing device 71 illustrated in FIG. 13 is preferably provided for filtering and/or for amplitude matching and/or for further functions. According to aspects of the invention, identification of components of the measurement signal is preferably carried out using the tunable filter. Here, fixedly prespecified signals, which are not generated from the measurement signal, are, for example for test purposes, fed back to the potential-controlled shield 11. Here, the tunable filter is advantageously configured in such a way that a signal correlation or signal transform, preferably a Fourier transform, can be carried out. Here, a test signal, for example, is introduced into the feedback loop, wherein the measurement signal corresponds to an additive superimposition and is correspondingly amplified.

According to a preferred further embodiment, the tunable filter is configured in such a way that either signals of a list are fed back in succession and the associated measurement signal is recorded or, correspondingly, a parametric signal, such as sin (2 pi f t+phi) or wavelet (a t–phi)) for example, is fed back and the parameter or parameters are varied and the associated measurement signal is recorded.

In addition, the feedback signal is tuned by the tunable filter through a certain frequency and phase range, for example for a Fourier transform. As an alternative, the tunable filter is, for example, configured in such a way that the tunable filter carries out a wavelet transform, preferably stretching and phase-shifting of test wavelets.

The method according to aspects of the invention is discussed by way of example below with reference to FIG. 1 to FIG. 13. The method according to aspects of the invention relates to a method for measuring an electric current in an electrical conductor 3, in particular using an apparatus 1 according to aspects of the invention. Here, the electric current is detected using a detection apparatus 5 of the apparatus 1 and a coupling between the electrical conductor 3 and the detection apparatus 5 is shielded using a shielding apparatus 7 of the apparatus 1. In addition, the shielding of the coupling is also controlled using the shielding apparatus. By way of example, a potential-controlled shield 11 of the shielding apparatus 7 is further controlled by a control unit 13 of the shielding apparatus 7. The potential-controlled shield 11 is preferably also controlled by the control unit in such a way that an electrical potential of the detection apparatus 5 is applied to the potential-controlled shield 11.

What is claimed is:

1. An apparatus for measuring an electric current in an electrical conductor, wherein the apparatus comprises:
   a detection apparatus including a Rogowski-Chattock coil for detecting the electric current; and
   a shielding apparatus shielding a coupling between the electrical conductor and the detection apparatus, the shielding apparatus configured to control the shielding of the coupling and including:
      a potential-controlled shield arranged between the electrical conductor and the detection apparatus, and
      a control unit connected to the potential-controlled shield and configured to apply an electrical potential that is based on a feedback loop to the potential-controlled shield that follows a time profile of electrical potential feedback of the Rogowski-Chattock coil.

2. The apparatus as claimed in claim 1, further comprising:
   an additional passive ground shield at least partially surrounding the potential-controlled shield.

3. The apparatus as claimed in claim 1, wherein:
   the detection apparatus further includes an evaluation unit;
   the evaluation unit includes an instrument amplifier having a plurality of operational amplifiers and a plurality of resistors for measuring and amplifying a measured electrical potential of the Rogowski-Chattock coil;
   the evaluation unit is connected to the control unit to convey the measured electrical potential of the Rogowski-Chattock coil to the control unit; and
   the control unit includes a low-pass filter connected to the potential-controlled shield to apply the electrical potential that is based on the feedback loop.

4. The apparatus as claimed in claim 3, wherein:
   the low-pass filter of the control unit includes a resistor/capacitor (RC) combination or an RC element.

5. The apparatus as claimed in claim 4, wherein:
   the low-pass filter of the control unit is configured such that half a wavelength of a limit frequency of the low-pass filter in the feedback loop is greater than or equal to a longest current path of the control unit.

6. The apparatus as claimed in claim 4, wherein:
   the low-pass filter of the control unit is configured such that half a wavelength of a limit frequency of the low-pass filter in the feedback loop is greater than or equal to a longest current path of the potential-controlled shield.

7. The apparatus as claimed in claim 4, wherein:
   the low-pass filter of the control unit is configured such that half a wavelength of a limit frequency of the low-pass filter in the feedback loop is greater than or equal to a coil conductor length of the Rogowski-Chattock coil.

8. The apparatus as claimed in claim 4, wherein:
   the measured electrical potential of the Rogowski-Chattock coil corresponds to a mean electrical potential of the Rogowski-Chattock coil via at least two coil connections;

the instrument amplifier of the evaluation unit outputs a common-mode sinusoidal signal that corresponds to the mean electrical potential of the Rogowski-Chattock coil;
the control unit includes a tracker and a shield driver;
the tracker includes at least one of a resonant circuit, a phased-locked loop (PLL) circuit, a likelihood estimator, or a Kalman filter that generates a corrected sinusoidal signal from the common-mode sinusoidal signal; and
the shield driver drives applies the electrical potential based on the corrected sinusoidal signal.

9. The apparatus as claimed in claim 4, wherein:
the measured electrical potential of the Rogowski-Chattock coil corresponds to a mean electrical potential of the Rogowski-Chattock coil via at least two coil connections;
the instrument amplifier of the evaluation unit outputs a common-mode sinusoidal signal that corresponds to the mean electrical potential of the Rogowski-Chattock coil;
the control unit includes a tunable filter and a shield driver;
the tunable filter filters the common-mode sinusoidal signal by performing at least one of a Fourier analysis or a wavelet analysis; and
the shield driver drives applies the electrical potential based on the Fourier analysis or the wavelet analysis.

\* \* \* \* \*